United States Patent
Daviot et al.

(10) Patent No.: US 7,235,188 B2
(45) Date of Patent: Jun. 26, 2007

(54) AQUEOUS PHOSPHORIC ACID COMPOSITIONS FOR CLEANING SEMICONDUCTOR DEVICES

(75) Inventors: Jerome Daviot, Glasgow (GB); Christopher Reid, Glasgow (GB); Douglas Holmes, Bridge of Weir (GB)

(73) Assignee: EKC Technology, Inc., Hayward, CA (US)

( * ) Notice: Subject to any disclaimer, the term of this patent is extended or adjusted under 35 U.S.C. 154(b) by 174 days.

(21) Appl. No.: 10/688,900

(22) Filed: Oct. 21, 2003

(65) Prior Publication Data

US 2004/0137736 A1    Jul. 15, 2004

Related U.S. Application Data

(60) Provisional application No. 60/430,365, filed on Dec. 3, 2002, provisional application No. 60/419,968, filed on Oct. 22, 2002.

(51) Int. Cl.
 *C09K 13/00* (2006.01)
(52) U.S. Cl. .................. 252/79.1; 252/79.2; 252/79.3; 252/79.4; 252/79.5; 510/175; 134/1.3
(58) Field of Classification Search ............... 252/79.1, 252/79.2, 79.4, 79.5; 134/1.3; 510/175
See application file for complete search history.

(56) References Cited

U.S. PATENT DOCUMENTS

| | | | | |
|---|---|---|---|---|
| 4,247,408 A * | 1/1981 | Imamura et al. ............ 510/432 |
| 5,262,285 A * | 11/1993 | Darmon et al. ............. 430/359 |
| 5,334,332 A * | 8/1994 | Lee ............................. 510/175 |
| 5,417,877 A | 5/1995 | Ward |
| 5,419,779 A * | 5/1995 | Ward ........................... 134/38 |
| 5,672,577 A | 9/1997 | Lee |
| 5,911,835 A * | 6/1999 | Lee et al. .................... 134/1.3 |
| 5,981,454 A * | 11/1999 | Small ......................... 510/175 |
| 6,030,932 A * | 2/2000 | Leon et al. ................. 510/175 |
| 6,045,817 A * | 4/2000 | Ananthapadmanabhan et al. ......................... 424/405 |
| 6,121,219 A * | 9/2000 | Herdt et al. ................. 510/218 |
| 6,147,042 A * | 11/2000 | Yata et al. ................... 510/175 |
| 6,149,828 A * | 11/2000 | Vaartstra ..................... 216/57 |
| 6,162,738 A * | 12/2000 | Chen et al. ................. 438/745 |
| 6,309,470 B1 * | 10/2001 | Schulhoff et al. ............ 134/26 |
| 6,465,403 B1 * | 10/2002 | Skee .......................... 510/175 |
| 6,475,967 B1 * | 11/2002 | Arvanitidou et al. ....... 510/235 |
| 6,599,370 B2 * | 7/2003 | Skee ............................ 134/3 |
| 6,686,297 B1 * | 2/2004 | Gogg et al. ................. 438/745 |
| 2002/0077259 A1 | 6/2002 | Skee et al. |
| 2003/0228990 A1 | 12/2003 | Lee et al. |

OTHER PUBLICATIONS

Published Application US 2002/0035762 A1, Mar. 2002.

* cited by examiner

*Primary Examiner*—Shamim Ahmed
(74) *Attorney, Agent, or Firm*—Morgan Lewis & Bockius LLP

(57) ABSTRACT

The present invention relates to dilute aqueous solutions containing phosphoric acid and methods for cleaning plasma etch residue from semiconductor substrates including such dilute aqueous solutions. The solution according to the invention may advantageous contain an alkaline compound, one or more other acid compounds, and/or a fluoride-containing compound and may optionally contain additional components such as organic solvents, chelating agents, amines, and/or surfactants.

35 Claims, No Drawings

AQUEOUS PHOSPHORIC ACID COMPOSITIONS FOR CLEANING SEMICONDUCTOR DEVICES

CROSS-REFERENCE TO RELATED APPLICATIONS

This application claims priority to U.S. Provisional Application Nos. 60/419,968 filed on Oct. 22, 2002 and 60/430,365 filed on Dec. 3, 2002, the entire contents of each of which are hereby incorporated by reference

FIELD OF THE INVENTION

The present invention relates to dilute aqueous solutions containing phosphoric acid and methods for cleaning plasma etch residue from semiconductor substrates including such dilute aqueous solutions. The compositions and methods according to the invention can advantageously provide both cleaning efficiency and material compatibility.

BACKGROUND OF THE INVENTION

Cleaners are needed during semiconductor fabrication, and one well-known family of cleaners known as HDA® is available from EKC Technology.

SUMMARY OF THE INVENTION

Dilute aqueous solutions of phosphoric acid in combination with alkaline compounds and/or acids can conveniently be used to clean plasma ash residues from semiconductor substrates. Cleaners are needed during semiconductor fabrication, and one well-known family of cleaners known as HDA® is available from EKC Technology.

Phosphoric acid is readily available as an 85% solution of $H_3PO_4$ in water. In this specification concentrations of phosphoric acid are specified as the per cent by weight of an 85% solution of $H_3PO_4$ in water, e.g., a concentration of about 2% is equivalent to about 1.7% $H_3PO_4$. Concentrations of other compounds are specified on 100% basis, even if the compound is ordinarily supplied as an aqueous solution (e.g., hydroxylamine is typically supplied as a 50% solution in water).

The present invention involves an aqueous semiconductor cleaning solution comprising: at least about 75%, alternately at least about 85%, by weight water; from about 0.5% to about 10% by weight phosphoric acid; and at least one alkaline compound selected from the group consisting of a quaternary ammonium hydroxide, a hydroxylamine derivative, an a mixture thereof. Optionally, the solution may also contain one or more other acid compounds, one or more fluoride-containing compounds, and/or one or more alkanolamines. Advantageously, the pH of the solution can be between about 2 and about 6.

In one embodiment, the at least one alkaline component includes a hydroxlyamine derivative present in an amount from about 0.3% to about 1% by weight. In another embodiment, the at least one alkaline component includes, and preferably is, hydroxylamine or N,N-diethylhydroxylamine.

In another embodiment, the at least one alkaline component includes a quaternary ammonium compound present in an amount from about 0.5% to about 3% by weight. In another embodiment, the at least one alkaline component includes, and preferably is, choline hydroxide.

In another embodiment, the optional one or more other acid compounds is present and may include hydrochloric acid, nitric acid, periodic acid, pyrophosphoric acid, fluorosilicic acid, sulfuric acid, methanesulfonic acid, oxalic acid, lactic acid, citric acid, xylenesulfonic acid, toluenesulfonic acid, formic acid, tartaric acid, propionic acid, benzoic acid, ascorbic acid, gluconic acid, malic acid, malonic acid, succinic acid, gallic acid, butyric acid, trifluoracetic acid, or mixtures thereof. Alternately or preferably, the one or more other acid compounds includes, and preferably is, glycolic acid, methanesulfonic acid, pyrophosphoric acid, oxalic acid, lactic acid, or citric acid. In another embodiment, the one or more other acids can be present in an amount from about 0.2% to about 5% by weight.

In yet another embodiment, the optional one or more fluorine-containing compounds is present in an amount from about 0.01% to about 0.1% by weight. In still another embodiment, the one or more fluorine-containing compounds includes, and preferably is, ammonium bifluoride and/or ammonium fluoride.

In one embodiment, the solution can further include an organic solvent in an amount from about 5% to about 15% by weight. In another embodiment, the organic solvent includes an organic acid alkyl ester.

In another embodiment, the solution can further include a surfactant.

In yet another embodiment, the solution can further include one or more alkanolamines, preferably monoethanolamine, 2-(2-hydroxylethylamino)ethanol, 2-(2-aminoethoxy)ethanol, N,N,N-tris(2-hydroxyethyl)-ammonia, isopropanolamine, 3-amino-1-propanol, 2-amino-1-propanol, 2-(N-methylamino)ethanol, 2-(2-aminoethylamino)ethanol, or a mixture thereof. In still another embodiment, the one or more alkanolamines is present in an amount from about 0.5% to about 5% by weight.

In alternate embodiments, the solution can be substantially free from one or more of the following: other acid compounds, fluoride-containing compounds, alkanolamines, hydroxylamine derivatives, organic solvents, and a combination thereof. In another alternate embodiment, the solution can contain substantially no additional components.

DEFINITIONS

Unless otherwise specified, all percentages expressed herein should be understood to refer to percentages by weight. Also, the term "about," when used in reference to a range of values, should be understood to refer to either value in the range, or to both values in the range.

As used herein, the phrases "contains substantially no" and "substantially free from," in reference to a composition means:

for major components including other acid components (not phosphoric acid), polar organic solvents including non-hydroxyl-containing amines, water, organic solvents, hydroxylamine and hydroxylamine derivatives, the aforementioned phrases should be understood to mean that the composition contains less than 1.5%, preferably less than about 1%, more preferably less than about 0.1%, of the specific element mentioned thereafter;

for minor components including chelating agents, corrosion inhibitors, fluoride-containing compounds, surfactants, and the like, the aforementioned phrases should be understood to mean that the composition contains less than about 0.1%, preferably less than about 0.01%, most preferably less than about 0.005%, of the specific element mentioned thereafter; and for trace contaminants such as metals or metal ions, the aforementioned phrases should be understood to mean that the composition contains less than about 50 ppm, preferably less than about 10 ppm.

Preferably, when one of the aforementioned phrases is used, the composition is completely free of any added element specifically mentioned thereafter, or at least does not contain the added element in an amount such that the element affects the efficacy, storability, usability regarding necessary safety concerns, or stability of the composition.

DETAILED DESCRIPTION OF THE PREFERRED EMBODIMENTS

Dilute aqueous solutions of phosphoric acid in combination with alkaline compounds and/or acids can conveniently be used to clean plasma ash residues from semiconductor substrates. Cleaners and residue removers that are dilute and that contain relatively inexpensive components are desired in the industry, because the cost of producing cleaners and residue removers is largely driven by the high cost of components contained therein. Similarly, dilute cleaners and residue removers are more easily disposed of, especially if most or all components therein are relatively non-toxic. Finally, dilute cleaners are less susceptible to change in properties from the evaporation of small quantities of water.

In one embodiment the invention is a cleaning and residue removing composition comprising:

a polar solvent, preferably water, but optionally polar organic solvent(s) or mixtures of water and polar organic solvent(s), wherein the polar solvent is present at least about 75%, alternately at least about 85%, and in a preferred embodiment at least about 92% polar solvent, for example at least about 94% by weight water;

phosphoric acid or salt thereof, wherein the phosphoric acid or salt thereof is present in an amount from about 0.01% to about 10%, preferably from about 0.1% to about 6%, more preferably from about 1% to about 4%, for example between about 1.7% to about 2.5% by weight of 85% phosphoric acid;

optionally, an alkaline compound, such as a quaternary ammonium compound as described herein, preferably choline hydroxide, choline derivatives such as bis and tris choline, or mixtures thereof, present in the solution in an amount from about 0.2% to about 5%, preferably from about 0.5% to about 3%, for example from about 1% to about 2.5% by weight;

optionally, an alkaline compound, such as a hydroxylamine derivative, preferably hydroxylamine or diethylhydroxylamine, present in the solution in an amount from about 0.1% to about 5%, preferably from about 0.2% to about 3%, for example from about 0.5% to about 1%, by weight not including the counterion of the salt if present;

optionally, an alkaline compound, such as an alkanolamine as described herein, preferably AEEA, present in the solution in an amount from about 0.2% to about 5%, preferably from about 0.5% to about 3%, for example from about 1% to about 2.5% by weight;

optionally, a fluoride-containing compound, such as hydrogen fluoride, ammonium fluoride, ammonium bifluoride, or mixtures thereof, present in the solution in an amount from about 0.001% to about 0.5%, preferably from about 0.005% to about 0.1%, for example from about 0.01% to about 0.05% by weight;

optionally, another acid compound, such as an inorganic acid like pyrophosphoric acid, periodic acid, or fluorosilicic acid, an organic acid like citric acid, lactic acid, glycolic acid, oxalic acid, a hybrid acid like methanesulfonic acid, or mixture thereof, present in the solution in an amount from about 0.05% to about 6%, preferably from about 0.2% to about 4%, for example from about 0.5% to about 2% by weight;

optionally, a chelating agent, for example catechol, EDTA, DTPA, or mixtures thereof, present in the solution in an amount from about 0.1% to about 8%, for example from about 0.5% to about 2% by weight;

optionally, an amine (that is not hydroxylamine derivative or alkanolamine), present in the solution in an amount from about 0.1% to about 20%, for example from about 0.5% to about 4% by weight; and optionally, a surfactant, for example an epoxy-polyamide compound, present in the solution in an amount from about 0.01% to about 3%, for example from about 0.1% to about 0.5% by weight.

In one preferred embodiment, the dilute aqueous cleaner consists essentially of: about 1.5% to about 2.5% by weight of phosphoric acid; about 0.5% to about 1% by weight of a hydroxylamine derivative, preferably hydroxylamine; and about 0.005% to about 0.04% by weight of a fluoride-containing compound, preferably ammonium bifluoride.

In one preferred embodiment, the dilute aqueous cleaner consists essentially of: about 1.5% to about 2.5% by weight of phosphoric acid; about 0.5% to about 1% by weight of a hydroxylamine derivative, preferably hydroxylamine; about 0.005% to about 0.04% by weight of a fluoride-containing compound, preferably ammonium bifluoride; and about 0.05% to about 0.2% by weight of a surfactant, preferably an epoxy-polyamide compound.

In one preferred embodiment, the dilute aqueous cleaner consists essentially of: about 1.5% to about 2.5% by weight of phosphoric acid; about 0.5% to about 1% by weight of a hydroxylamine derivative, preferably hydroxylamine; and about 0.005 % to about 0.1% by weight of a fluoride-containing compound, preferably ammonium fluoride.

In one preferred embodiment, the dilute aqueous cleaner consists essentially of: about 1.5% to about 2.5% by weight of phosphoric acid; about 0.5% to about 1% by weight of a hydroxylamine derivative, preferably hydroxylamine; about 0.005% to about 0.1% by weight of a fluoride-containing compound, preferably ammonium fluoride; and about 5% to about 15% by weight of a polar organic solvent, preferably an organic acid alkyl ester such as ethyl lactate.

In one preferred embodiment, the dilute aqueous cleaner consists essentially of about 1.5% to about 2.5% by weight of phosphoric acid and about 0.5% to about 1.5% by weight of a quaternary ammonium salt, preferably choline hydroxide.

In one preferred embodiment, the dilute aqueous cleaner consists essentially of: about 1.5% to about 4% by weight of phosphoric acid; and about 1% to about 4% by weight of an other acid compound, preferably an organic acid such as oxalic acid, lactic acid, citric acid, glycolic acid, or a mixture thereof.

In one preferred embodiment, the dilute aqueous cleaner consists essentially of:

about 1.5% to about 4%, more preferably between about 1.7% to about 2.5%, for example about 2% by weight of 85% phosphoric acid;

about 0.3% to about 4%, more preferably between about 0.5% to about 2%, for example about 1% by weight of a first organic acid compound, preferably a difunctional organic acid, such as oxalic acid dihydrate;

about 0.3% to about 4%, more preferably between about 0.5% to about 2%, for example about 1% by weight of a second organic acid compound which is different than the first organic acid compound, preferably a monofunctional organic acid, such as formic acid; and between about 90% and about 99%, more preferably between about 93 and 98%, for example about 96%, by weight of water. Such composition has substantially no organic solvents, substantially no SARA 3 hazardous compounds, exhibits very little corrosion on ST formulations. Optionally the composition may contain between about 0.1% and about 1% of a chelator, such as EDTA.

Other dilute aqueous cleaner compositions consists essentially of:

optionally about 0.5% to about 6% by weight of 85% phosphoric acid;

about 2% to about 12%, more preferably between about 3% to about 10% by weight of a first organic acid compound, preferably a difunctional organic acid, such as oxalic acid dihydrate;

optionally about 0.2% to about 15%, more preferably between about 6% to about 12% by weight of a second organic acid compound which is different than the first organic acid compound, preferably a monofunctional organic acid, such as formic acid;

optionally between about 0.05% and 1.5%, more preferably between about 0.5% to about 1.5% of an ammonium salt, for example ammonium hydroxide, an alkyl ammonium hydroxide substituted with 2 or 3, preferably 3, alkyl moieties independently selected from methyl and ethyl moieties, for example tetramethyl ammonium hydroxide, or a mixture thereof;

between about 80% and about 94% water. Such composition has substantially no organic solvents, substantially no SARA 3 hazardous compounds, exhibits very little corrosion on ST formulations. Optionally the composition may contain between about 0.1 % and about 1% of a chelator, such as EDTA.

Phosphoric acid is readily available as an 85% solution of $H_3PO_4$ in water. In this specification concentrations of phosphoric acid are specified as the per cent by weight of an 85% solution of $H_3PO_4$ in water, e.g., a concentration of about 2% is equivalent to about 1.7% $H_3PO_4$. Unless specifically stated, concentrations of other compounds are specified on 100% basis, even if the compound is ordinarily supplied as an aqueous solution (e.g., hydroxylamine is typically supplied as a 50% solution in water).

The present invention involves an aqueous semiconductor cleaning solution comprising: at least about 75%, alternately at least about 85%, by weight water; from about 0.5% to about 10% by weight phosphoric acid; and at least one alkaline compound selected from the group consisting of a quaternary ammonium hydroxide, a hydroxylamine derivative, an a mixture thereof. Optionally, the solution may also contain one or more other acid compounds, one or more fluoride-containing compounds, and/or one or more alkanolamines. Advantageously, the pH of the solution can be between about 2 and about 6.

Concentrations of phosphoric acid up to 10% are useful for cleaning, according to the principles of this invention, although concentrations of about 0.5% to about 6%, preferably about 2% to about 3%, by weight are preferred when considering cleaning ability, material compatibility, and cost. In other embodiments, the concentration of phosphoric acid may alternately be from about 1% to about 8% by weight, from about 2% to about 6% by weight, from about 1% to about 4% by weight.

In this specification, dilute aqueous solutions is defined as containing at least about 75% by weight water, preferably at least about 85% by weight, for example at least about 90% by weight or at least about 95% by weight. In one embodiment, the concentration of water in the solutions according to the invention is from about 75% to about 95% by weight. In another embodiment, the concentration of water in the solutions according to the invention is from about 80% by to about 90% by weight.

In one embodiment, the dilute aqueous solution containing phosphoric acid according to the invention is substantially free of abrasive particles such as typical metal oxide abrasives (e.g., alumina, silica, ceria, zirconia, magnesia, and the like).

Alkaline Compounds

Dilute aqueous solutions of phosphoric acid may also contain alkaline compounds for improved utility as cleaners. Exemplary alkaline compounds include, but are not limited to, quaternary ammonium compounds, hydroxylamine or hydroxylamine derivatives, alkanolamines, and mixtures thereof. In some embodiments, an amine can be used as an alkaline compound. In other embodiments, amines qualify only as other additive components.

Exemplary quaternary ammonium compounds include, but are not limited to, ammonium hydroxide; alkylammonium compounds such as monoalkylammonium hydroxide, dialkylammonium hydroxide, trialkylammonium hydroxide, and/or tetraalkylammonium hydroxides (e.g., tetramethylammonium hydroxide, choline hydroxide, di(2-hydroxyethyl)dimethylammonium hydroxide, tris(2-hydroxyethyl)methylammonium hydroxide, and the like, and mixtures thereof); and mixtures thereof. While the hydroxide counterion is preferred for these quaternary ammonium compounds, other alternate counterions are also contemplated, including, but not limited to, bisulfite, sulfite, sulfate, nitrate, nitrite, phosphate, phosphite, carbonate, trifluoroacetate, organic carboxylates from organic acids such as those listed herein, and the like, and combinations thereof. Compounds containing two or more ammonium moieties are also useful, both as a cleaning additive and as a chelating agent.

Exemplary hydroxylamine derivatives satisfy the general formula:

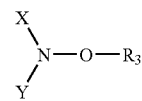

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic $C_4$–$C_7$ ring.

Examples of derivatives of hydroxylamine according to the invention include, but are in no way limited to, hydroxylamine; alkylhydroxylamines such as N-methyl-hydroxylamine, N,N-dimethyl-hydroxylamine, N-ethyl-hydroxylamine, N,N-diethyl-hydroxylamine, methoxylamine, ethoxylamine, N-methyl-methoxylamine, N-isopropylhydroxylamine, and the like, and mixtures thereof. It should be understood that hydroxylamine and its derivatives, as defined above, are available (and may be included in a composition according to the invention) as above, as salts (e.g., sulfate salts, nitrate salts, phosphate salts, or the like), or as a combination thereof. In the present invention, these hydroxylamine salts and their derivatives should be characterized as hydroxylamine derivatives herein, and not as quaternary ammonium compounds.

Alkanolamines according to the invention may advantageously be those two-carbon atom linkage alkanolamines having the following formula:

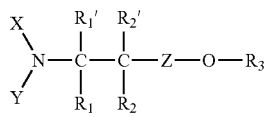

wherein $R_1$, $R_1'$, $R_2$, $R_2'$, and $R_3$ are, independently in each case, hydrogen or a linear, branched, or cyclic hydrocarbon containing from 1 to 7 carbon atoms; wherein Z is a group having the formula $-(-Q-CR_1R_1'-CR_2R_2'-)_m-$, such that m is a whole number from 0 to 3 (i.e., when m=0, there is no atom between the $-CR_2R_2'-$ group and the $-OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either $-O-$ or $-NR_3-$; and wherein X and Y are, independently in each case, hydrogen, a $C_1$–$C_7$ linear, branched, or cyclic hydrocarbon, or a group having the formula $-CR_1R_1'-CR_2R_2'$-Z-F, with F being either $-O-R_3$ or $-NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$–$C_7$ ring.

Exemplary alkanolamines include, but are not limited to, monoethanolamine, 2-(2-hydroxyethylamino)ethanol (i.e., diethanolamine or DEA), 2-(2-aminoethoxy)ethanol (i.e., diglycolamine or DGA), N,N,N-tris(2-hydroxyethyl)-ammonia (i.e., triethanolamine or TEA), isopropanolamine, 3-amino-1-propanol (i.e., n-propanolamine or NPA), 2-amino-1-propanol ("monoisopropanolamine" or "MIPA"), 2-(N-methylamino)ethanol (i.e., monomethylethanolamine or MMEA), 2-(2-aminoethylamino)ethanol (i.e., aminoethylaminoethanol or AEEA), and mixtures thereof.

Choline hydroxide and hydroxylamine are preferred alkaline compounds. In an alternate preferred embodiment, an alkanolamine can be a preferred alkaline compound.

In one embodiment, alkaline compounds according to the invention may be present in the solution in an amount from about 0.5% to about 5%, alternately from about 0.5% to about 3%, from about 1% to about 3%, from about 0.2% to about 1.5%, from about 0.2% to about 2%, from about 0.2% to about 1%, from about 0.5% to about 1.5%, from about 1.5% to about 3%, or from about 1.5% to about 2.5%.

In another embodiment, the solution according to the invention can be substantially free from alkaline compounds. In still another embodiment, the solution according to the invention can be substantially free from alkanolamines, but may contain quaternary ammonium compounds and/or hydroxylamine or hydroxylamine derivatives. In yet another embodiment, the solution according to the invention can be substantially free from hydroxylamine or hydroxylamine derivatives, but may contain quaternary ammonium compounds and/or alkanolamines. In yet another embodiment, the solution according to the invention can be substantially free from quaternary ammonium compounds, but may contain hydroxylamine or hydroxylamine derivatives and/or alkanolamines. In yet another embodiment, the solution according to the invention can be substantially free from quaternary ammonium compounds and hydroxylamine or hydroxylamine derivatives, but may contain alkanolamines. In yet another embodiment, the solution according to the invention can be substantially free from quaternary ammonium compounds and alkanolamines, but may contain hydroxylamine or hydroxylamine derivatives. In yet another embodiment, the solution according to the invention can be substantially free from alkanolamines and hydroxylamine or hydroxylamine derivatives, but may contain quaternary ammonium compounds.

Other Acids

Dilute aqueous solutions of phosphoric acid may also include other acid compounds for improved utility as cleaners. Exemplary acids include, but are not limited to, other inorganic acids such as hydrochloric acid, nitric acid, periodic acid, pyrophosphoric acid, fluorosilicic acid, sulfuric acid, and the like, and mixtures thereof; organic acids such as oxalic acid, lactic acid, citric acid, formic acid, tartaric acid, propionic acid, benzoic acid, ascorbic acid, gluconic acid, malic acid, malonic acid, succinic acid, gallic acid, butyric acid, and the like, and mixtures thereof; other hybrid acids such as methanesulfonic acid, xylenesulfonic acid, toluenesulfonic acid, trifluoracetic acid, and the like, and mixtures thereof; and mixtures thereof.

In one embodiment, the other acid compounds according to the invention may be present in the solution in an amount from about 0.5% to about 5%, alternately from about 0.5% to about 3%, from about 1% to about 3%, from about 0.2% to about 1.5%, from about 0.2% to about 2%, from about 0.2% to about 1%, from about 0.5% to about 1.5%, from about 1.5% to about 3%, or from about 1.5% to about 2.5%.

The multifunctional carboxylic acids (i.e., compounds having two or more, alternately three or more, carboxylic acid functional groups on the same molecule) are preferred acids.

In another embodiment, the solution according to the invention can be substantially free from other acid compounds.

Fluoride Compounds

The dilute aqueous solutions of phosphoric acid may also include a fluoride compound for improved utility as cleaners. Suitable fluoride compounds include, but are not limited to, ammonium fluoride, ammonium bifluoride, hydrogen fluoride, alkylammonium fluoride, alkylammonium bifluoride, and the like, and mixtures thereof. In another embodiment, the solution according to the invention can be substantially free from fluoride-containing compounds.

In one embodiment, the fluoride-containing compound is present in the solution in an amount from about 0.001% to about 0.5%, preferably from about 0.005% to about 0.1%, for example from about 0.01% to about 0.05% by weight.

Other Components

The dilute aqueous solutions of phosphoric acid may optionally contain additional components such as organic solvents, chelating agents (e.g., those not qualifying as other acid compounds), amines (e.g., those not qualifying as quaternary ammonium compounds, hydroxylamine or hydroxylamine derivatives, or alkanolamines, as described above), and/or surfactants. In one embodiment, additional components including, but not limited to, those enumerated above may be added to the solution to achieve a specific goal. In another embodiment, the dilute aqueous solution according to the invention contains substantially no additional components.

Organic solvents may be either polar or non-polar. Generally, non-polar organic solvents are not preferred, though high boiling alcohols and the like may be used. Examples of polar organic solvents for the composition according to the invention include, but are in no way limited to, dimethyl sulfoxide, ethylene glycol, organic acid alkyl (e.g., $C_1$–$C_6$) esters such as ethyl lactate, ethylene glycol alkyl ether, diethylene glycol alkyl ether, triethylene glycol alkyl ether, propylene glycol, propylene glycol alkyl ether, dimethyl sulfoxide, N-substituted pyrrolidone such as N-methyl-2-pyrrolidone (NMP), sulfolanes, dimethylacetamide, and the like, or any combination thereof. In one embodiment where polar organic solvents are present, the boiling point of the polar organic solvent(s) is(are) at least about 85° C., alternately at least about 90° C. or at least about 95° C. Care must be taken because, in the absence of alkanolamines and the like, certain organic solvent may be only slightly miscible with the water of the aqueous phosphoric acid solution according to the invention.

In one embodiment, an organic solvent is present in the solution according to the invention in an amount from about 2% to about 15%, alternately from about 5% to about 15%, from about 8% to about 12%, from about 7% to about 15%, from about 3% to about 10%, or from about 4% to about 13%.

According to the present invention, amines, particularly alkanolamines and also particularly low molecular weight amines, are separate from, and are not classified as, a polar organic solvent. Other additional polar organic solvents as known in the art, other than those specifically excluded, can also be used in the composition of the present invention. In an alternate embodiment, the composition according to the invention is substantially free from organic solvents as defined herein.

Examples of chelating agents include, but in no way limited to, mono-, di-, or multi-hydroxybenzene-type compounds, e.g., such as catechol, resorcinol, butylated hydroxytoluene ("BHT"), and the like, or a combination thereof. In one embodiment the chelators include three or more carboxylic acid-containing moieties, e.g., such as ethylenediamine tetraacetic acid ("EDTA"), non-metallic EDTA salts, and the like, or a combination thereof. Compounds containing a two carboxylic acid moieties are less preferred. Compounds containing both hydroxyl and carboxylic acid moieties are useful in one embodiment. Aromatic compounds containing thiol groups, e.g., such as thiophenol; amino-carboxylic acids; diamines, e.g., such as ethylene diamine; polyalcohols; polyethylene oxide; polyamines; polyimines; or a combination thereof, are useful in one embodiment. In one embodiment, one or more chelating agents can be used in one composition, where the chelating agents are selected from groups described above. Alternately or additionally, some chelating agents are described in U.S. Pat. No. 5,417,877, issued May 23, 1995 to Ward, and in commonly assigned U.S. Pat. No. 5,672,577, issued Sept. 30, 1997 to Lee, the disclosures of each of which are incorporated herein by reference. In an alternate embodiment, the composition is substantially free from chelating agents.

In one embodiment, a chelating agent is present in the solution according to the invention in an amount from about 0.1% to about 10%, alternately from about 1% to about 10%, from about 0.5% to about 5%, from about 0.5% to about 3%, from about 0.1% to about 2%, or from about 1% to about 3%.

In one embodiment, the composition according to the invention optionally contains an amine compound that is not a hydroxyl-containing amine and is not an alkanolamine. Examples of such amine compounds include, but are in no way limited to, o-diaminobenzene, p-diaminobenzene, N-(2-aminoethyl)-ethylenediamine ("AEEDA"), piperazine, N-substituted piperazine derivatives, piperidine, N-substituted piperidine derivatives, diethylene triamine, 2-methyleneaminopropylenediamine, hexamthylene tetramine, and the like, or a combination thereof. Amines may increase corrosion of certain sensitive metals. In an alternate embodiment, the composition according to the invention is substantially free from non-hydroxyl-containing amine compounds.

In one embodiment, an amine compound is present in the solution according to the invention in an amount from about 0.1% to about 10%, alternately from about 1% to about 10%, from about 0.5% to about 5%, from about 0.5% to about 3%, from about 0.1% to about 2%, or from about 1% to about 3%.

In one embodiment, the composition according to the invention may also contain a surfactant. Examples of surfactants include, but are in no way limited to, sodium laurel sulfate, sodium stearate, epoxy-polyamide, and the like, or a combination thereof. In an alternate embodiment, the composition according to the invention is substantially free from surfactants.

In one embodiment, a surfactant is present in the solution according to the invention in an amount from about 0.1% to about 10%, alternately from about 1% to about 10%, from about 0.5% to about 5%, from about 0.5% to about 3%, from about 0.1% to about 2%, or from about 1% to about 3%.

pH

The pH of the dilute aqueous solutions of phosphoric acid may vary considerably from one formulation to another, and the optimum pH can be readily ascertained by evaluating cleaning efficiency and material compatibility at various pH levels. In particular, different pH values are useful with different substrates. In one embodiment, the pH of the solution is between about 1.5 and about 5, alternately between about 2 and about 4.5, between about 1.5 and about 10, between about 1.5 and about 9, between about 2 and about 6, or between about 1.5 and about 6.

Substrates

The dilute aqueous solutions of phosphoric acid are advantageous for cleaning residues from vias of varying aspect ratios and from metal structures. The metal structures may be simple plugs of metal, such as tungsten, or metal stacks including two or more of titanium nitride, aluminum, copper, aluminum/copper alloy, titanium, tungsten, tantalum, and other metals useful in semiconductor fabrication, as well as mixtures or alloys thereof. Additionally or alternately, the substrate may include (e.g., as at least a portion of one or more layers) metal nitrides, metal oxides, metal oxynitrides, and/or "metal alloys" with atoms or compounds other than metals (e.g., phosphorus, boron, sulfur, or the like).

Cleaning Process

The dilute aqueous solutions of phosphoric acid may be applied to the semiconductor substrate through various methods. For instance, application may be as a bath in which the substrate is submerged. Alternately, the aqueous solution may be applied as a spray directed to the surface of the substrate. Mechanical agitation, ultrasonic and megasonic waves, bath circulation, rotation or other motion of the substrate, and other additional steps may be used as is well-known in the art.

The low volatility of the dilute aqueous solutions of phosphoric acid permits high operating temperature, e.g., up to about 90° C. or higher, of the cleaning process, although "room temperature" operation of about 20° C. to about 30° C. provides a good combination of cleaning efficiency and material compatibility for most applications.

The time required for the cleaning process is dependent upon the residue to be removed, operating temperature and method of application. Typical time is from about 5 to about 30 minutes, alternately from about 3 to about 30 minutes, from about 3 to about 15 minutes, from about 3 to about 20 minutes, from about 5 to about 10 minutes, from about 5 to about 15 minutes, or from about 5 to about 20 minutes, and can be readily ascertained by evaluating cleaning efficiency and material compatibility at various times.

Considering that the removal of the post etch residue in the presence of phosphoric acid is believed to be via the formation of an intermediate phosphate complex, but without being bound to theory, the presence of a quaternary ammonium or the formation of a cation through the acid-base reaction may enhance the cleaning ability of the blend. It is believed that this enhancement may arise through electrostatic interaction between the cation from the base and the anionic residue phosphate complex.

Furthermore, without being bound to theory, the investigation indicated that residue removal is probably not by a proton initiated dissolution mechanism, because of the poor cleaning results obtained solutions containing only phosphoric acid and the other acid compounds, even those other acids that were very strong. It is surmised, therefore, that the cleaning ability of the preferred solutions according to the invention is probably due mainly to the chelating properties and dissolution ability of the other acid component (e.g., in combination with phosphoric acid).

A rinse step typically, although not always, follows the application of the dilute aqueous solutions of phosphoric acid. The rinse material may be water, alcohol such as isopropyl alcohol, a water/alcohol blend, or a rinse material as described in U.S. Pat. No. 5,981,454, the entire disclosure of which is incorporated herein by express reference hereto. Use of a rinse step is preferred, and water is the preferred rinse material.

EXAMPLES

Exemplary embodiments of the present invention will be illustrated by reference to the following examples, which are included to exemplify, but not to limit, the scope of the present invention.

Examples 1–28

Dilute aqueous solutions of phosphoric acid as described in Table 1 and Table 2 have been used to clean plasma etch residues from semiconductor substrates. The following abbreviations are used for solution components:

| | |
|---|---|
| TMAH—tetramethylammonium hydroxide | EL—ethyl lactate |
| CHOL—choline hydroxide | PPA—pyrophosphoric acid |
| DEHA—N,N-diethylhydroxylamine | ABF—ammonium bifluoride |
| AEEA—2-(2-aminoethylamino)ethanol | AF—ammonium fluoride |
| MSA—methanesulfonic acid | EPA—epoxy-polyamide |

Unless otherwise specified, all values delimited in the Tables of these Examples, with the exception of pH values and corrosion and cleaning ratings, are expressed in terms of weight percent.

Table 1 below provides compositions of examples 1 to 12.

| Example | $H_3PO_4$ (%) | Alkaline Compound | % | Other Comnpounds | % | pH |
|---|---|---|---|---|---|---|
| 1 | 2 | DEHA | 0.94 | | | |
| 2 | 2 | AEEA | 1.2 | | | |
| 3 | 2 | CHOL | 0.99 | | | 2.1 |
| 4 | 2 | HDA | 0.65 | ABF | 0.02 | 5.2 |
| | | | | EPA | 0.12 | |
| 5 | 2 | HDA | 0.65 | ABF | 0.02 | 5.2 |
| 6 | 3 | HDA | 0.75 | AF | 0.04 | 5 |
| 7 | 2 | HDA | 0.65 | AF | 0.04 | 5 |
| | | | | EL | 10.0 | |
| 8 | 2 | HDA | 0.5 | | | 5 |
| 9 | 2 | AEEA | 1 | | | 2.8 |
| 10 | 6 | CHOL | 2.2 | | | |
| 11 | 6 | AEEA | 2 | | | |
| 12 | 6 | CHOL | 2.2 | Glycolic | 2 | |

Table 2 below provides compositions of examples 13 to 28.

| Example | $H_3PO_4$ (wt. %) | Other Acid | % (wt.) |
|---|---|---|---|
| 13 | 2 | MSA | 1.47 |
| 14 | 2 | PPA | 3.0 (pH=0.8) |
| 15 | 2 | Fluorosilicic | 0.24 |
| 16 | 2 | Oxalic | 2.0 |
| 17 | 4 | Oxalic | 2.0 |
| 18 | 6 | Glycolic | 1.0 |
| 19 | 3 | Oxalic | 2.0 |
| 20 | 3 | Lactic | 2.0 |
| 21 | 4 | Lactic | 2.0 |
| 22 | 3 | Citric | 2.0 |
| 23 | 4 | Citric | 2.0 |
| 24 | 3 | PPA | 0.5 |
| 25 | 3 | Glycolic | 2.0 |
| 26 | 6 | Glycolic | 2.0 |
| 27 | 3 | PPA | 2.0 |
| 28 | 3 | PPA | 4.0 |

The solution of Example 25 was used in a bath application to clean plasma etch vias. The residue was removed after about 8 minutes at about 30° C. The cleaned residue from metal lines after about 5 minutes at about 30 ° C.

The solution of Example 3 was used in a spray application in a Semitool apparatus ma etch residue from metal stacks. The stacks consisted of titanium nitride-per alloy-titanium-titanium nitride on silica. Process conditions in the tool were about 30° C., approximately 1 gallon per minute (GPM) flow rate, about 140 or about 300 revolutions per minute (RPM), and application time of about 5 or about 10 minutes. Residues were removed at both RPM settings at both application times. No corrosion or pitting was noted at about 5 minutes although slight pitting was noted at about 10 minutes.

The solutions of Examples 4–5 were used to clean metal stacks in a Semitool as previously described. Residues were removed and no corrosion or pitting was noted for either sample at both RPM settings and both application times.

The solutions of Examples 3–5 were used in a spray application in a Semitool apparatus to clean aluminum lines on a tantalum substrate. Process conditions were the same as previously described. Residues were removed and no corrosion or pitting was noted at both RPM settings and both application times.

The solution of Example 3 was used in a spray application in an FSI apparatus to clean plasma etch residue from metal stacks from three sources. All of the stacks consisted of titanium nitride-aluminum/copper alloy-titanium-titanium nitride on silica. Process conditions in the tool were about 25 or 35° C., approximately 1 liter per minute (LPM) flow rate, about 400 RPM, and application time of about 5 or about 10 minutes. For the stacks from the first source, residues were removed at 25° C. at about 10 minutes with no corrosion or pitting. For the stacks from the second source, traces of residue remained but these likely would be removed with longer application times; no corrosion or pitting was noted. For the stacks from the third source residues were removed after about 10 minutes at both temperatures, with no corrosion or pitting observed.

The solutions of Examples 4–7 were used in a bath application at about room temperature to remove plasma etch residues from metal stacks from three sources. Residues were removed within about 5 minutes. No corrosion or pitting was noted after about 20 minutes.

The solutions of Examples 19, 20, 23, and 25 were used in a bath application at room temperature to remove plasma etch residues from champagne vias and metal lines. Residues were removed in process times of about 3–15 minutes, and no corrosion or pitting was noted.

All of the above-described process examples used a deionized water (DIW) rinse following the cleaning step.

Examples 29–33 and Comparative Example 1

A series of dilute aqueous solutions of phosphoric acid and choline hydroxide, Examples 29–33, were prepared as shown in Table 3 below and used in a bath application to remove residue. Comparative Example 1 shows the result of using a dilute aqueous solution of choline hydroxide without any phosphoric acid present. Cleaning efficiency was rated on a 0–10 point scale with 10 being complete removal. Corrosion and pitting was rated on a 0–10 point scale with 0 being no corrosion and pitting.

TABLE 3

| Example | pH | Corrosion | Cleaning | Phosphoric acid | Choline hydroxide |
|---------|-----|-----------|----------|-----------------|-------------------|
| 29 | 1.4 | 0 | 6 | 2 | 0 |
| 30 | 2 | 0 | 10 | 2 | 2.2 |
| 31 | 5 | 0.5 | 10 | 2 | 4.8 |
| 32 | 7 | 1 | 8 | 2 | 5.5 |
| 33 | 9 | 4 | 10 | 2 | 8 |
| Comp. Ex. 1 | 12 | 10 | 10 | 0 | 2.2 |

Process time and temperature could be optimized for the solution with pH from about 5 to about 9 to provide both complete cleaning and acceptable corrosion and pitting. All of the above-described process examples used a deionized water (DIW) rinse following cleaning step.

Although the present invention is described with reference to certain preferred embodiments, it is apparent that modification and variations thereof may be made by those skilled in the art without departing from the spirit and scope of this invention as defined by the appended claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of materials, methods, and components otherwise used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims, and not limited to the foregoing description.

What is claimed is:

1. An aqueous semiconductor cleaning solution having a pH between about 1.5 and about 6 and comprising:
   at least about 75% by weight of a mixture of water and an organic solvent;
   from about 0.5% to about 10% by weight phosphoric acid;
   optionally one or more other acid compounds;
   optionally one or more fluoride-containing compounds; and
   at least one alkaline compound selected from the group consisting of:
      a trialkylammonium hydroxide and/or
      a tetraalkylammonium hydroxide;
      a hydroxylamine derivative having the structural formula:

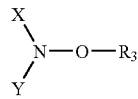

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic $C_4$–$C_7$ ring; and
   one or more alkanolamines having the structural formula:

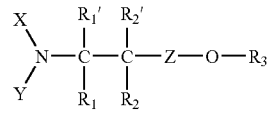

wherein $R_1$, $R_1'$, $R_2$, $R_2'$, and $R_3$ are, independently in each case, hydrogen or a linear, branched, or cyclic hydrocarbon containing from 1 to 7 carbon atoms; wherein Z is a group having the formula -(-Q-$CR_1R_1'$—$CR_2R_2'$—)$_m$—, such that m is a whole number from 0 to 3 (i.e., when m=0, there is no atom between the —$CR_2R_2'$— group and the —$OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either —O— or —$NR_3$—; and wherein X and Y are, independently in each case, hydrogen, a $C_1$-$C_7$ linear, branched, or cyclic hydrocarbon, or a group having the formula —$CR_1R_1'$—$CR_2R_2'$—Z-F, with F being either —O—$R_3$ or —$NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$–$C_7$ ring.

2. The aqueous semiconductor cleaning solution of claim 1, wherein the pH of the solution is between about 2 and about 6.

3. The aqueous semiconductor cleaning solution of claim 1, wherein the at least one alkaline component comprises a hydroxlyamine derivative present in an amount from about 0.3% to about 1% by weight.

4. The aqueous semiconductor cleaning solution of claim 1, wherein the at least one alkaline component comprises hydroxylamine or N,N-diethylhydroxylamine.

5. The aqueous semiconductor cleaning solution of claim 1, wherein the at least one alkaline component comprises a tri-alkylammonium hydroxide or tetra-alkylammonium hydroxide present in an amount from about 0.5% to about 3% by weight.

6. The aqueous semiconductor cleaning solution of claim 5, wherein the at least one alkaline component comprises choline hydroxide.

7. The aqueous semiconductor cleaning solution of claim 1, which comprises one or more other acid compounds selected from the group consisting of hydrochloric acid, nitric acid, periodic acid, pyrophosphoric acid, fluorosilicic acid, sulfuric acid, methanesulfonic acid, oxalic acid, lactic acid, citric acid, xylenesulfonic acid, toluenesulfonic acid, formic acid, tartaric acid, propionic acid, benzoic acid, ascorbic acid, gluconic acid, malic acid, malonic acid, succinic acid, gallic acid, butyric acid, trifluoracetic acid, and mixtures thereof.

8. The aqueous semiconductor cleaning solution of claim 1, wherein the aqueous semiconductor cleaning solution comprises one or more other acid compounds selected from glycolic acid, methanesulfonic acid, pyrophosphoric acid, oxalic acid, lactic acid, and citric acid.

9. The aqueous semiconductor cleaning solution of claim 8, wherein the one or more other acids are present in an amount from about 0.2% to about 5% by weight.

10. The aqueous semiconductor cleaning solution of claim 1, wherein the aqueous semiconductor cleaning solution comprises one or more fluorine-containing compounds present in an amount from about 0.01% to about 0.1% by weight.

11. The aqueous semiconductor cleaning solution of claim 1, wherein the aqueous semiconductor cleaning solution comprises one or more fluorine-containing compounds comprising ammonium bifluoride and/or ammonium fluoride.

12. The aqueous semiconductor cleaning solution of claim 1, wherein the organic solvent is in an amount from about 5% to about 15% by weight.

13. The aqueous semiconductor cleaning solution of claim 12, wherein the organic solvent comprises an organic acid ester.

14. The aqueous semiconductor cleaning solution of claim 1, comprising a surfactant.

15. The aqueous semiconductor cleaning solution of claim 1, wherein the at least one alkaline compound includes one or more alkanolamines selected from the group consisting of monoethanolamine, 2-(2-hydroxylethylamino)ethanol, 2-(2-aminoethoxy)ethanol, N,N,N-tris(2-hydroxyethyl)-ammonia, isopropanolamine, 3-amino-1-propanol, 2-amino-1-propanol, 2-(N-methylamino)ethanol, 2-(2-aminoethylamino)ethanol, and mixtures thereof.

16. The aqueous semiconductor cleaning solution of claim 1, wherein the at least one alkaline compound includes one or more alkanolamines present in an amount from about 0.5% to about 5% by weight.

17. The aqueous semiconductor cleaning solution of claim 1, wherein the solution is substantially free from other acid compounds.

18. The aqueous semiconductor cleaning solution of claim 1, wherein the solution is substantially free from fluoride-containing compounds.

19. The aqueous semiconductor cleaning solution of claim 1, wherein the solution is substantially free from alkanolamines.

20. The aqueous semiconductor cleaning solution of claim 1, wherein the solution contains substantially no additional components.

21. The aqueous semiconductor cleaning solution of claim 1, wherein the solution is substantially free from hydroxylamine derivatives.

22. The aqueous semiconductor cleaning solution of claim 1, wherein the solution is substantially free from organic solvents.

23. The aqueous semiconductor cleaning solution of claim 1, wherein the concentration of water is at least about 85% by weight.

24. A dilute aqueous semiconductor cleaner and residue remover having a pH between about 1.5 and about 6 and comprising:
   a mixture of water and one or more polar organic solvents, present in an amount of at least about 75% by weight;
   phosphoric acid or salt thereof, present in an amount from about 0.1% to about 6% by weight of 85% phosphoric acid;
   hydroxylamine or a hydroxylamine derivative, present in the solution in an amount from about 0.1% to about 5% by weight not including the counterion of the hydroxylamine derivative salt, if present;
   optionally, a tri-alkylammonium hydroxide and/or tetra-alkylammonium hydroxide, present in the solution in an amount from about 0.2% to about 5% by weight;
   optionally, an alkanolamine, present in the solution in an amount from about 0.2% to about 5% by weight;
   optionally, a fluoride-containing compound, present in the solution in an amount from about 0.001% to about 0.5% by weight;
   optionally, an other acid compound, present in the solution in an amount from about 0.05% to about 6% by weight;
   optionally, a chelating agent, present in the solution in an amount from about 0.1% to about 8% by weight; and
   optionally, a surfactant, present in the solution in an amount from about 0.01% to about 3% by weight.

25. The dilute aqueous cleaner and residue remover of claim 24, wherein the cleaner and residue remover consists essentially of: water; one or more polar organic solvents; about 1.5% to about 2.5% by weight of phosphoric acid; about 0.5% to about 1% by weight of a hydroxylamine or hydroxylamine derivative; and about 0.005% to about 0.04% by weight of a fluoride-containing compound, and wherein the cleaner and residue remover is substantially free from surfactants.

26. The dilute aqueous cleaner and residue remover of claim 24, wherein the cleaner and residue remover consists essentially of: one or more polar organic solvents; about 1.5% to about 2.5% by weight of phosphoric acid; about 0.5% to about 1% by weight of a hydroxylamine derivative; about 0.005% to about 0.04% by weight of a fluoride-containing compound; and about 0.05% to about 0.2% by weight of a surfactant.

27. A dilute aqueous cleaner and residue remover consisting essentially of: one or more polar organic solvents: about 1.5% to about 2.5% by weight of phosphoric acid; about 0.5% to about 1% by weight of a hydroxylamine or hydroxylamine derivative; and about 0.005% to about 0.1% by weight of a fluoride-containing compound.

28. A dilute aqueous cleaner and residue remover consisting essentially of: about 1.5% to about 2.5% by weight of phosphoric acid; about 0.5% to about 1% by weight of a hydroxylamine derivative; about 0.005% to about 0.1% by weight of a fluoride-containing compound; and about 5% to about 15% by weight of a polar organic solvent.

29. A dilute aqueous semiconductor cleaner and residue remover consisting essentially of: 1.5% to about 2.5% by weight of phosphoric acid; and 0.5% to about 1.5% by weight of a tri-alkylammonium salt and/or tetra-alkylammonium salt.

30. A dilute aqueous cleaner and residue remover having a pH between about 1.5 and about 6 consisting essentially of: about 1.5% to about 4% by weight of 85% phosphoric acid; about 0.3% to about 4% by weight of oxalic acid dihydrate; about 0.3% to about 4% by weight of a monofunctional organic acid; about 90% to about 99% by weight of water; and optionally between about 0.1% and about 1% of a chelator, wherein the formulation contains substantially no organic solvents and no compounds listed as SARA 3 hazardous compounds on the filing date of this application.

31. A dilute aqueous cleaner and residue remover consisting essentially of: about 0.5% to about 6% by weight of 85% phosphoric acid; about 2% to about 12% by weight of oxalic acid dihydrate; optionally about 0.2% to about 15% by weight of a monofunctional organic acid; optionally between about 0.05% and 1.5% by weight of: ammonium hydroxide, an alkyl ammonium hydroxide substituted with 2 or 3 alkyl moieties independently selected from methyl and ethyl moieties, or a mixture thereof; optionally between about 0.1% and about 1% of a chelator; and water, wherein the pH of the cleaner and residue remover is between 1.5 and 9, and the cleaner and residue remove contains substantially no organic solvents and no compounds listed as SARA 3 hazardous compounds on the filing date of this application.

32. A dilute aqueous cleaner and residue remover consisting essentially of: about 1.5% to about 4% by weight of 85% phosphoric acid; about 1% to about 4% by weight of glycolic acid; and about 92% to about 97.5% by weight of water.

33. The semiconductor cleaning solution of claim 32, wherein the solution is substantially free from: alkanolamines, quaternary ammonium compounds, hydroxylamine and hydroxylamine derivatives, other acid compounds, fluoride-containing compounds, organic solvents, non-hydroxyl-containing amines, chelating agents, and surfactants.

34. A dilute aqueous cleaner and residue remover consisting essentially of: about 3% to about 6% by weight of 85% phosphoric acid; about 1% to about 2% by weight of glycolic acid; and about 92% to about 96% by weight of water.

35. The semiconductor cleaning solution of claim 34, wherein the solution is substantially free from: alkanolamines, quaternary ammonium compounds, hydroxylamine and hydroxylamine derivatives, other acid compounds, fluoride-containing compounds, organic solvents, non-hydroxyl-containing amines, chelating agents, and surfactants.

* * * * *